(12) United States Patent
Miyazaki (10) Patent No.: US 9,819,924 B2
(45) Date of Patent: Nov. 14, 2017

(54) IMAGE PICKUP ELEMENT AND IMAGE PICKUP APPARATUS (71) Applicant: OLYMPUS CORPORATION, Tokyo (JP)

(72) Inventor: Kanto Miyazaki, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 288 days.

(21) Appl. No.: 14/663,096

(22) Filed: Mar. 19, 2015

(65) Prior Publication Data
US 2015/0195503 A1 Jul. 9, 2015

Related U.S. Application Data (63) Continuation of application No. PCT/JP2013/005566, filed on Sep. 20, 2013.

(30) Foreign Application Priority Data

Sep. 20, 2012 (JP) .................................. 2012-206662

(51) Int. Cl.
H04N 13/02 (2006.01)
H04N 13/00 (2006.01)
(Continued)

(52) U.S. Cl.
CPC ..... *H04N 13/0011* (2013.01); *G02B 13/0015* (2013.01); *H01L 27/14623* (2013.01);
(Continued)

(58) Field of Classification Search
CPC ......... H01L 27/14623; H01L 27/14607; H01L 27/14627; H01L 27/14636;
(Continued)

(56) References Cited

U.S. PATENT DOCUMENTS

| 6,396,873 | B1 | 5/2002 | Goldstein et al. |
| 2009/0219432 | A1 | 9/2009 | Palum et al. |
| 2013/0222546 | A1* | 8/2013 | Takahashi ......... H01L 27/14623 348/46 |

FOREIGN PATENT DOCUMENTS

| JP | 2003-523646 A | 8/2003 |
| JP | 2008-15754 A | 1/2008 |

(Continued)

OTHER PUBLICATIONS

International Search Report dated Dec. 17, 2013 issued in corresponding application PCT/JP2013/005566.
(Continued)

*Primary Examiner* — Sath V Perungavoor
*Assistant Examiner* — Peet Dhillon
(74) *Attorney, Agent, or Firm* — Westerman, Hattori, Daniels & Adrian, LLP (57) ABSTRACT An image pickup element includes a pair of light-receiving elements that are configured to receive light from an object and are disposed for each lens among two-dimensionally arranged lenses, one of the light-receiving elements outputting a pixel signal forming one captured image in a pair of captured images having parallax for displaying a stereoscopic image of the object, and the other of the light-receiving elements outputting a pixel signal forming the other captured image in the pair of captured images, and wiring that is disposed between the light-receiving elements and is configured to transmit an input signal or an output signal of the light-receiving elements. Light leaking from one picture element to an adjacent picture element is blocked by the wiring layer, thereby preventing a reduction in resolution and in the stereoscopic effect of a stereoscopic image.

4 Claims, 8 Drawing Sheets (51) Int. Cl.
  *G02B 13/00*  (2006.01)
  *H01L 27/146*  (2006.01)
(52) U.S. Cl.
  CPC ... *H04N 13/0232* (2013.01); *H01L 27/14607* (2013.01); *H01L 27/14627* (2013.01); *H01L 27/14636* (2013.01); *H04N 13/0217* (2013.01)
(58) Field of Classification Search
  CPC .......... H04N 13/0232; H04N 13/0217; H04N 13/0011; G02B 13/0015
  See application file for complete search history.

(56)  References Cited

FOREIGN PATENT DOCUMENTS

| JP | 2009-64924 A | 3/2009 |
| JP | 2009-65095 A | 3/2009 |
| JP | 2011-515045 A | 5/2011 |
| JP | 2011-199643 A | 10/2011 |
| WO | 2012/042963 A1 | 4/2012 |

OTHER PUBLICATIONS

Office Action dated Oct. 18, 2016, issued in counterpart Japanese Application No. 2012-206662, with English translation (13 pages).

\* cited by examiner

IMAGE PICKUP ELEMENT AND IMAGE PICKUP APPARATUS

CROSS-REFERENCE TO RELATED APPLICATION

This application is a continuation of International Application No. PCT/JP2013/005566, with an international filing date of Sep. 20, 2013, which claims priority to and the benefit of Japanese Patent Application No. 2012-206662 filed Sep. 20, 2012, the entire contents of which are incorporated herein by reference.

TECHNICAL FIELD

The embodiments below relate to an image pickup element provided with pairs of light-receiving elements that output respective pixel signals forming a pair of captured images having parallax and that are disposed for each lens in a two-dimensional array of lenses, and to an image pickup apparatus provided with the image pickup element.

BACKGROUND

A known structure for using a single image pickup element to capture a pair of images having parallax for displaying a stereoscopic image is to provide a left/right pair of light-receiving elements for each microlens in a two-dimensional array of lenses and to construct a left-eye captured image from the pixel signal obtained with the left-eye light-receiving element and a right-eye captured image from the pixel signal obtained with the right-eye light-receiving element. Examples of such image pickup elements are disclosed in JP 2011-515045 A (PTL 1) and JP 2003-523646 A (PTL 2).

CITATION LIST

Patent Literature

PTL 1: JP 2011-515045 A
PTL 2: JP 2003-523646 A

The present invention provides an image pickup element that may prevent a reduction in resolution and in the stereoscopic effect of a stereoscopic image. The present invention also provides an image pickup apparatus that includes this image pickup element.

SUMMARY

An image pickup element according to the present invention includes a pair of light-receiving elements that are configured to receive light from an object and are disposed for each lens among two-dimensionally arranged lenses, one of the light-receiving elements outputting a pixel signal forming one captured image in a pair of captured images having parallax for displaying a stereoscopic image of the object, and the other of the light-receiving elements outputting a pixel signal forming the other captured image in the pair of captured images; and wiring that is disposed between the light-receiving elements and configured to transmit an input signal or an output signal of the light-receiving elements.

In a preferred embodiment, the wiring in the image pickup element is disposed between pairs of the light-receiving elements.

In another preferred embodiment, $1.4 \leq (1/p) \cdot (r/(nav2-1) - hb) \leq 3$, where r is a radius of curvature of each of the lenses, p is a pitch of the lenses, nav2 is an average refractive index of a medium between the lenses and the wiring, and hb is a distance from a light-receiving surface of the light-receiving elements to the wiring.

Another aspect of the present invention provides an image pickup apparatus including the aforementioned image pickup element and a display unit configured to display a stereoscopic image based on the aforementioned pair of captured images.

The embodiments below may prevent a reduction in resolution and in the stereoscopic effect of a stereoscopic image.

BRIEF DESCRIPTION OF THE DRAWINGS

The present invention will be further described below with reference to the accompanying drawings, wherein.

DETAILED DESCRIPTION

In an example related to the present invention, when a stereoscopic image is divided into picture elements each constituted by a pair of pixels having parallax, then each microlens and the corresponding pair of light-receiving elements correspond to a picture element, and the individual light-receiving elements correspond to pixels in each captured image. For example when the numerical aperture on the image side of the image pickup lens is large and the F-number is small, light rays with a large inclination may enter the microlens. If the light that passes through a microlens corresponding to one picture element enters the light-receiving element corresponding to an adjacent picture element, the accuracy of the pixel signal may degrade, the resolution of the stereoscopic image may degrade, and crosstalk between the pair of captured images may occur, thereby reducing the stereoscopic effect of the stereoscopic image.

In contrast with the above example, the following describes an embodiment of the present invention.

Figure 1:
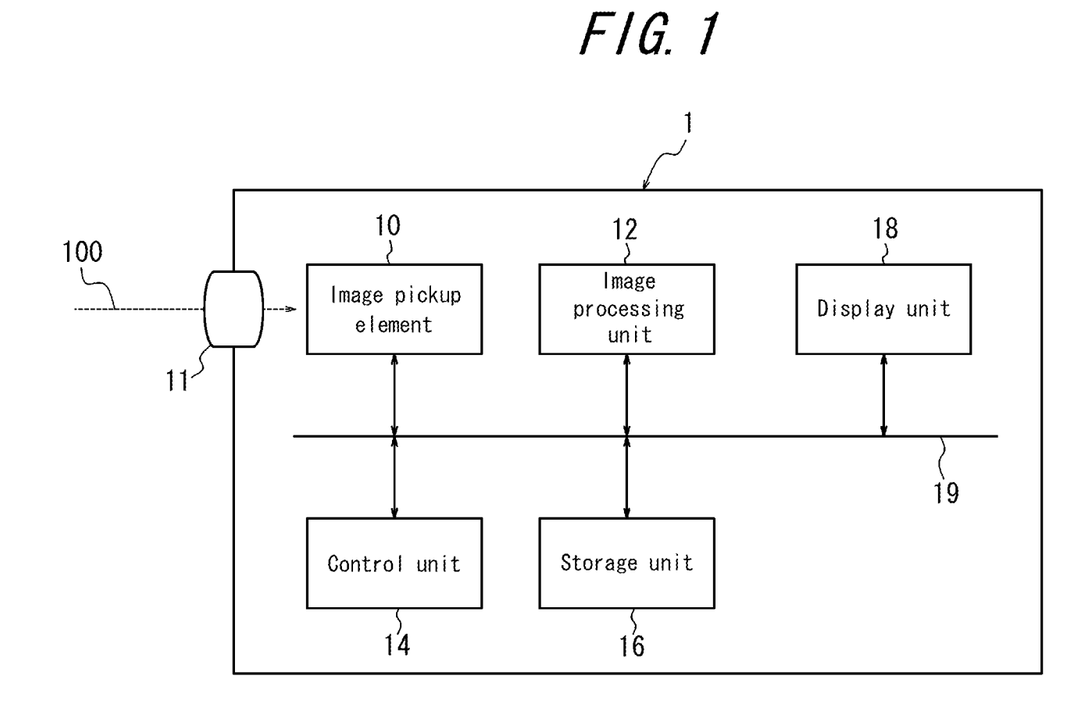
FIG. 1 is a block diagram schematically illustrating the structure of an image pickup apparatus according to an embodiment.

FIG. 1 is a block diagram schematically illustrating the structure of an image pickup apparatus according to the present embodiment. Based on object light 100 from the object of shooting, the image pickup apparatus 1 captures a pair of images having parallax for displaying a stereoscopic image. The image pickup apparatus 1 includes an image pickup lens 11, an image pickup element 10, an image processing unit 12, a control unit 14, a storage unit 16, and a display unit 18. The image pickup element 10, image processing unit 12, control unit 14, storage unit 16, and display unit 18 are connected by a bus 19 and transmit and receive a variety of signals to and from each other.

Upon object light 100 entering via the image pickup lens 11, the image pickup element 10 captures a left-eye image and a right-eye image having parallax based on the object light 100 and outputs pixel signals forming each captured image. Each captured image is formed by two-dimensionally arranged pixels. The number of pixels constituting one frame of a captured image is, for example, from 640×480 pixels to 4000×3000 pixels, yet the number of pixels is not limited to this range. The image pickup element 10 is a Complementary Metal Oxide Semiconductor (CMOS) or Charge Coupled Device (CCD) having a light-receiving element disposed in correspondence with each pixel, generates a pixel signal via the light-receiving elements, and outputs the pixel signal. The pixel signal is, for example, generated and output frame by frame. The pixel signal is, for example, a signal indicating a gradation of the colors red (R), green (G), and blue (B) for each pixel. The pixel signal may also be a digital signal yielded, for example, by A/D conversion of the signal output from the light-receiving elements.

The image processing unit 12 performs predetermined image processing, such as color and luminance correction, distortion correction, and the like, as well as data compression and expansion on captured image data including the pixel signals for one frame. The image processing unit 12 for example performs image processing on the captured image data for each frame. The image processing unit 12 may, for example, be a processor such as a Digital Signal Processor (DSP) or an Application Specific Integrated Circuit (ASIC).

The storage unit 16 is a frame memory storing captured image data before and/or after image processing. The storage unit 16 is, for example, Static Random Access Memory (SRAM) or Dynamic RAM (DRAM). The storage unit 16 may include a data read/write device for a variety of storage media including a hard disk and portable flash memory.

The display unit 18 displays a stereoscopic image based on the captured image data. The display unit 18 for example includes a liquid crystal display (LCD) and a control circuit for the LCD, the LCD being provided with a polarization filter corresponding to the parallax between the left and right eyes. The display unit 18 displays the left and right captured image data having parallax so as to display a stereoscopic image that the user can perceive stereoscopically.

The control unit 14 sends control signals to the image pickup element 10, image processing unit 12, storage unit 16, and display unit 18 and comprehensively controls operations of the image pickup apparatus 1. The control unit 14 is, for example, a microcomputer.

Figure 2:
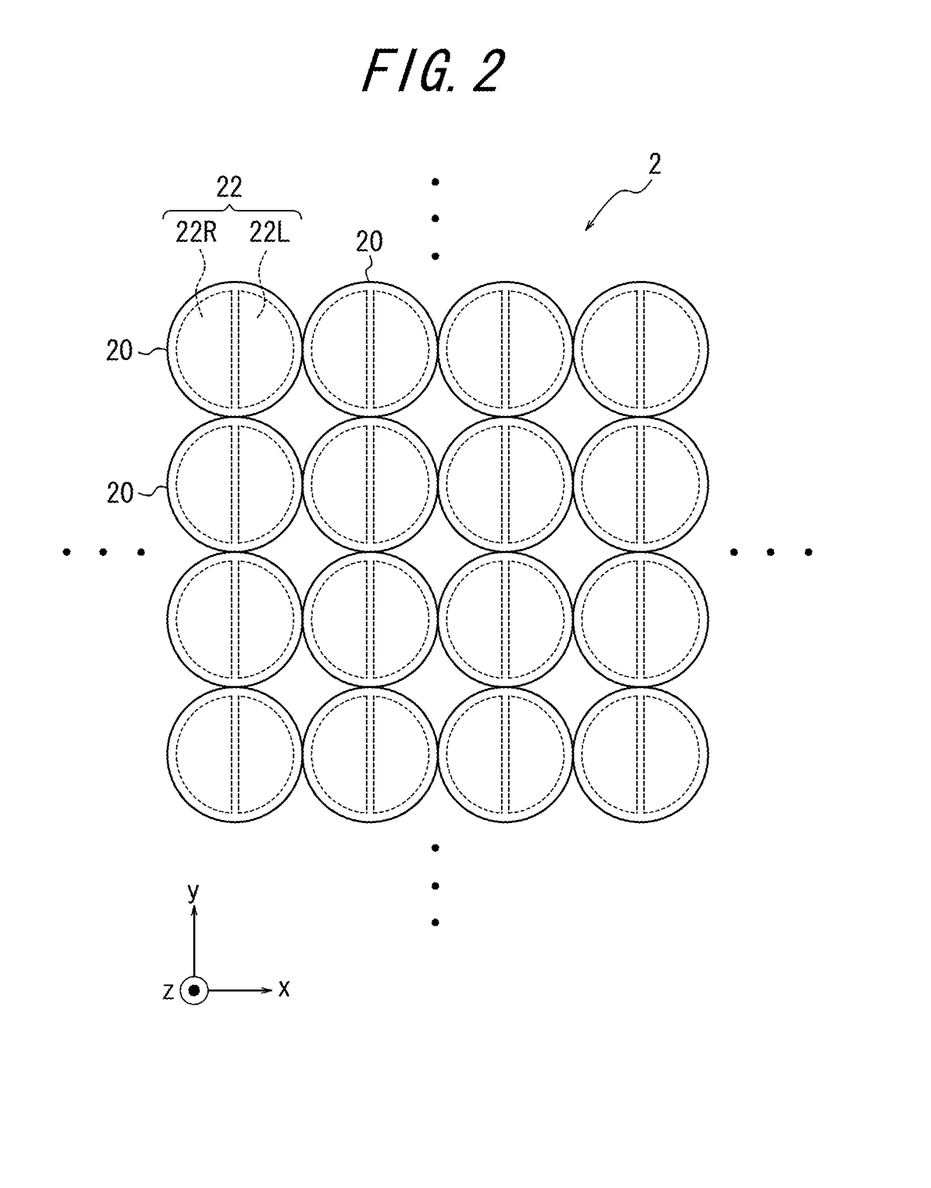
FIG. 2 illustrates the structure of portions of an image pickup element.
Figure 3:
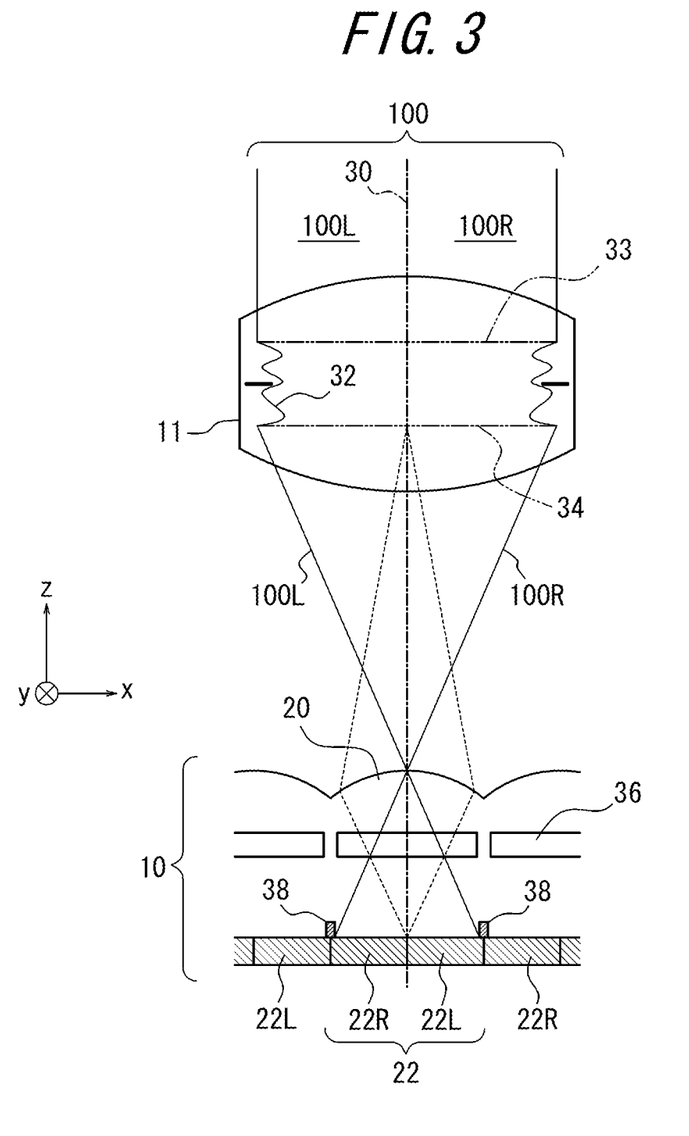
FIG. 3 illustrates the structure of portions of an image pickup element.

FIGS. 2 and 3 illustrate the structure of portions of the image pickup element 10.

As illustrated in FIG. 2, the image pickup element 10 includes a lens group 2 formed by two-dimensionally arranged spherical microlenses 20. The microlenses 20 are arranged in correspondence with picture elements of the stereoscopic image. Here, the direction of the x-axis corresponds to the horizontal direction of the captured image, and the direction of the y-axis corresponds to the vertical direction of the captured image. The direction of the z-axis corresponds to the direction of the optical axis.

The image pickup element 10 also includes a pair of light-receiving elements 22 arranged for each microlens 20. Here, for the sake of convenience, the pair of light-receiving elements 22 is only shown for a portion of the lens group 2. The pair of light-receiving elements 22 is formed by a light-receiving element 22L and a light-receiving element 22R. For a pair of captured images having parallax for displaying a stereoscopic image, the light-receiving element 22L generates and outputs a pixel signal forming a left-eye captured image, and the light-receiving element 22R generates and outputs a pixel signal forming a right-eye captured image. The light-receiving elements 22L and 22R are arranged to be adjacent in the x-axis direction, i.e. in the horizontal direction. The light-receiving elements 22L and 22R correspond to respective pixels in the pair of captured images for displaying a stereoscopic image.

FIG. 3 is a cross-sectional diagram along the z-axis of the image pickup element 10. As illustrated in FIG. 3, the object light 100 enters the image pickup element 10 via the image pickup lens 11. The object light 100 passes through the image pickup lens 11 via an entrance pupil 33 and an exit pupil 34 that have a diameter corresponding to a diaphragm 32. The object light 100 that has passed through the image pickup lens 11 is collected on each microlens 20 to form an image of the object, via a color filter 36, on the light-receiving elements 22L and 22R of the pair of light-receiving elements 22. The color filter 36 for each picture element is one of the colors R, G, and B. Accordingly, light that is one of the colors of R, G, and B strikes the light-receiving elements 22L and 22R and forms an image of the object.

In each picture element, within the object light 100, the light beam 100L on the left side with respect to the optical axis 30 strikes the left-eye light-receiving element 22L, and the light beam 100R on the right side strikes the right-eye light-receiving element 22R. The light-receiving element 22L generates and outputs a pixel signal of a pixel forming the left-eye captured image. On the other hand, the light-receiving element 22R generates and outputs a pixel signal of a pixel forming the right-eye captured image. The light-receiving elements 22R and 22L are, for example, photodiodes included in a CMOS or CCD.

A wiring layer 38 is disposed between pairs of light-receiving elements 22. Wiring that transmits an input signal or an output signal of the light-receiving elements 22R and 22L is layered in the wiring layer 38. The effects of the wiring layer 38 are described next with reference to FIGS. 4 and 5.

Figure 4:
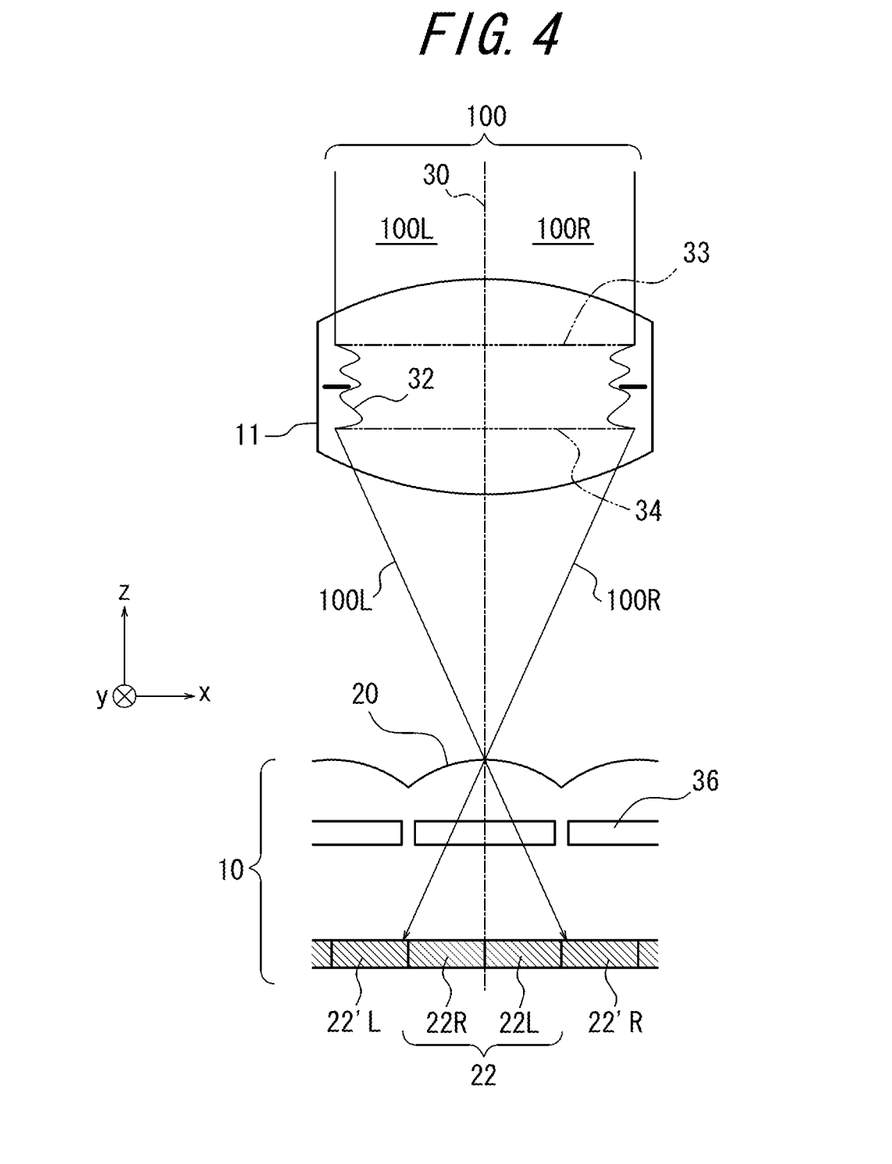
FIG. 4 illustrates the effect of the wiring layer.

FIG. 4 illustrates a cross-section of an image pickup element 10 that does not include a wiring layer 38 such as the one illustrated in FIG. 3. The structure shared in common with FIG. 3 is labeled with the same reference signs as FIG. 3. As illustrated in FIG. 4, for example when the numerical aperture on the image side of the image pickup lens 11 is large (i.e. when the F-number is small), light rays with a large inclination enter the microlens 20. Here, focusing on a pair of light-receiving elements 22 for one picture element, the light beam 100L on the left side may leak from the left-eye light-receiving element 22L and strike the right-eye light-receiving element 22'R for an adjacent picture element, and the light beam 100R on the right side may leak from the right-eye light-receiving element 22R and strike the left-eye light-receiving element 22'L for an adjacent picture element. In this case, a light beam passing through the color filter 36 for a different color than the proper color is mixed into each picture element, causing irregular color over the entire captured image. Furthermore, the light beam striking the microlens 20 for each picture element ends up constituting light for the adjacent picture element, thereby also leading to a reduction in resolution. As a result, the resolution of the stereoscopic image may degrade, and due to crosstalk between the left and right captured images, the stereoscopic effect of the stereoscopic image may be reduced. With respect to these problems, the wiring layer 38 in the present embodiment has the following effects.

Figure 5:
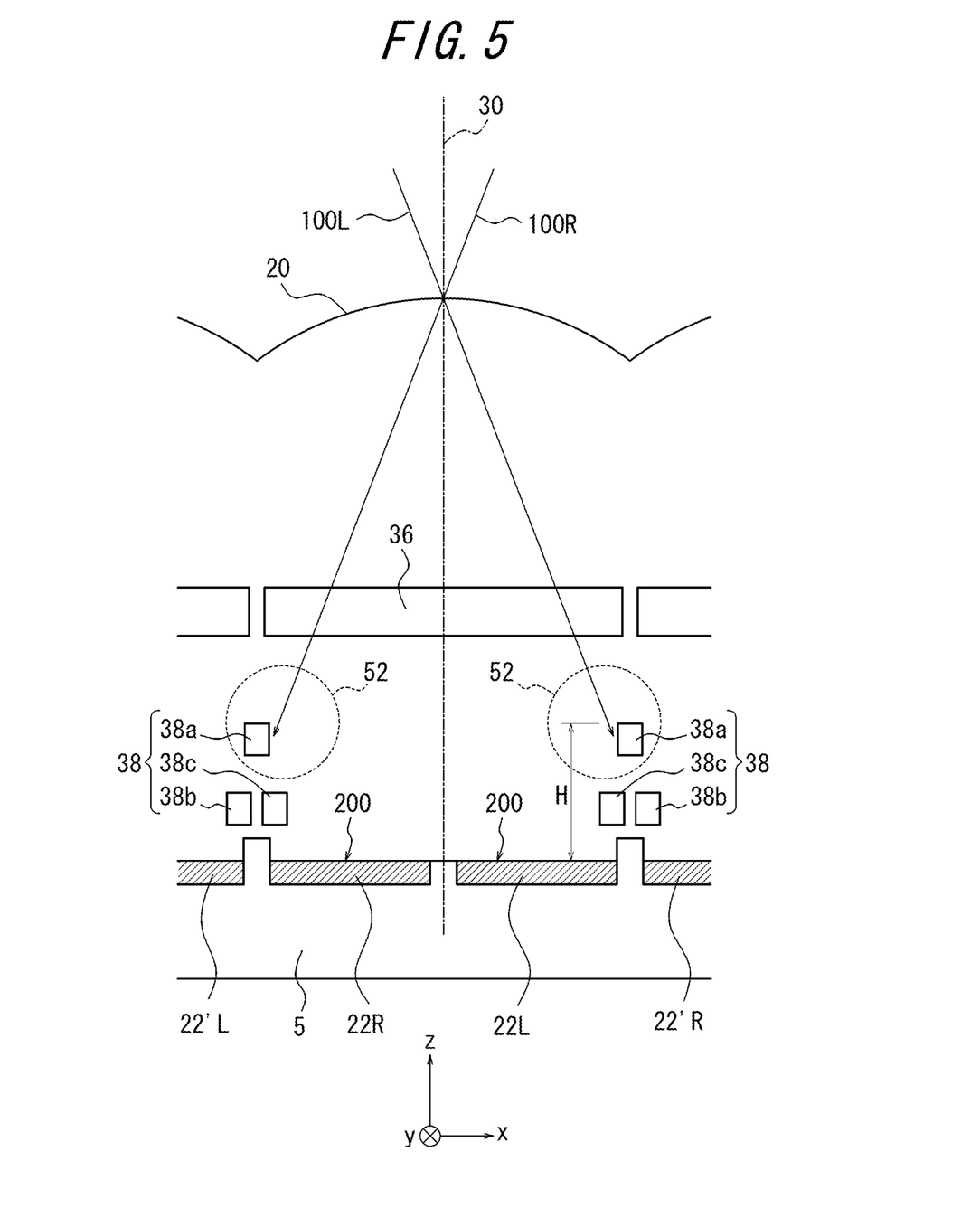
FIG. 5 illustrates the effect of the wiring layer.

FIG. 5 is an expanded view of a portion of the wiring layer 38 in the cross-section illustrated in FIG. 3. The structure shared in common with FIG. 3 is labeled with the same reference signs as FIG. 3. In the present embodiment, by providing the wiring layer 38, the wiring layer 38 blocks the light beams 100L and 100R that would leak from the light-receiving elements 22L and 22R (52) and prevents the light beams 100L and 100R from striking the light-receiving elements 22'R and 22l of adjacent picture elements.

Furthermore, an example is illustrated of forming the wiring layer 38 by layering wiring 38a, 38b, and 38c on a Si substrate 5. The wiring 38a, 38b, and 38c is wiring for transmitting a row or column selection signal to select the light-receiving element that outputs the pixel signal, wiring for transmitting the pixel signal that is output, and/or a ground wire. The wiring 38a to 38c is made from metal. Upon a light beam reaching the wiring layer 38 formed by the metal wiring 38a to 38c, the light is reflected or diffused yet does not pass through the wiring layer 38. Therefore, when a light beam that passes through the microlens 20 in a certain picture element reaches the wiring layer 38, the light beam may be prevented from directly reaching the light-receiving elements 22L and 22R of the adjacent picture element. Here, the region from the microlens 20 to the light-receiving surface 200 of the light-receiving elements 22L and 22R is filled with a medium such as organic material or $SiO_2$, and no air layer exists.

In a preferred embodiment, the wiring 38a to 38c is made of aluminum that has a light blocking effect. In this way, light may be effectively blocked. However, when the wiring 38a to 38c is, for example, made from copper through which light passes to some degree, a compensatory light blocking effect may be provided accordingly by disposing the wiring layer 38 at a certain height H (distance from the surface of the substrate 5 along the z-axis).

In the present embodiment, due to the effects of the above-described wiring layer 38, light beams from adjacent picture elements may be prevented from being mixed into each picture element without providing an additional structure in the image pickup element 10. Degradation of the resolution and stereoscopic effect of the stereoscopic image may thus be avoided.

Figure 6:
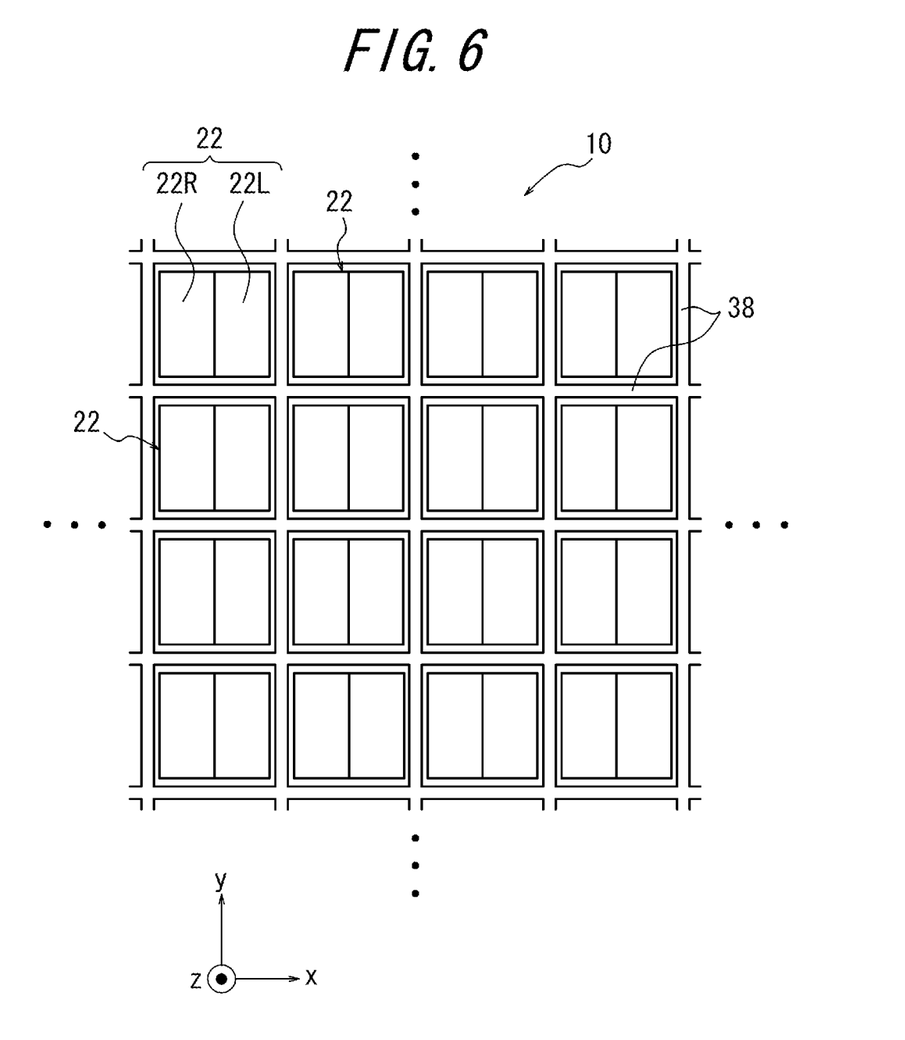
FIG. 6 illustrates the arrangement of the wiring layer.

FIG. 6 illustrates the state of the wiring layer 38 disposed in the image pickup element 10 in the x-y plane. In FIG. 6, the light-receiving elements 22R and 22L are depicted arranged as squares. The shape of the light-receiving elements is not limited to the illustrated example and may be any shape. In FIG. 6, a square composed of a pair of light-receiving elements 22R and 22L forms a pair of light-receiving elements 22 and corresponds to one picture element. As illustrated in FIG. 6, the wiring layer 38 is disposed between pairs of light-receiving elements 22 in the direction of the x-axis (i.e. in the horizontal direction of the captured image). As a result, the light beams 100L and 100R on the left side and right side in each picture element may be prevented from striking the right-eye and left-eye light-receiving elements 22R and 22L of adjacent picture elements. The wiring layer 38 may be provided along the x-axis for every two or more pairs of light-receiving elements 22 or for each set of a random number of pairs of light-receiving elements 22, yet as illustrated in FIG. 6, the wiring layer 38 is preferably provided for each pair of light-receiving elements 22. Furthermore, the wiring layer 38 may be provided between the light-receiving elements 22R and 22L in a pair of light-receiving elements 22. Doing so may prevent a reduction in the resolution and stereoscopic effect of the stereoscopic image.

Along the y-axis (i.e. in the vertical direction of the captured image), the wiring layer 38 is provided between light-receiving elements 22L and light-receiving elements 22R of adjacent picture elements. Doing so may prevent light leaking in the vertical direction in each picture element from entering the light-receiving element of vertically adjacent picture elements. Accordingly, it is possible to prevent the resolution of the captured image from degrading due to the entrance of light from vertically adjacent picture elements, which would cause the resolution of the stereoscopic image to degrade. The wiring layer 38 may be provided along the y-axis for every two or more light-receiving elements 22L and 22R or for each set of a random number of light-receiving elements 22L and 22R, yet as illustrated in FIG. 6, the wiring layer 38 is preferably provided for each light-receiving element 22L and 22R. Doing so may more effectively prevent the resolution of the stereoscopic image from degrading.

Here, an example in which the light-receiving elements are aligned in rows and columns is illustrated, yet the present embodiment also includes the case of, for example, aligning the light-receiving elements in a honeycomb shape.

Figure 7:
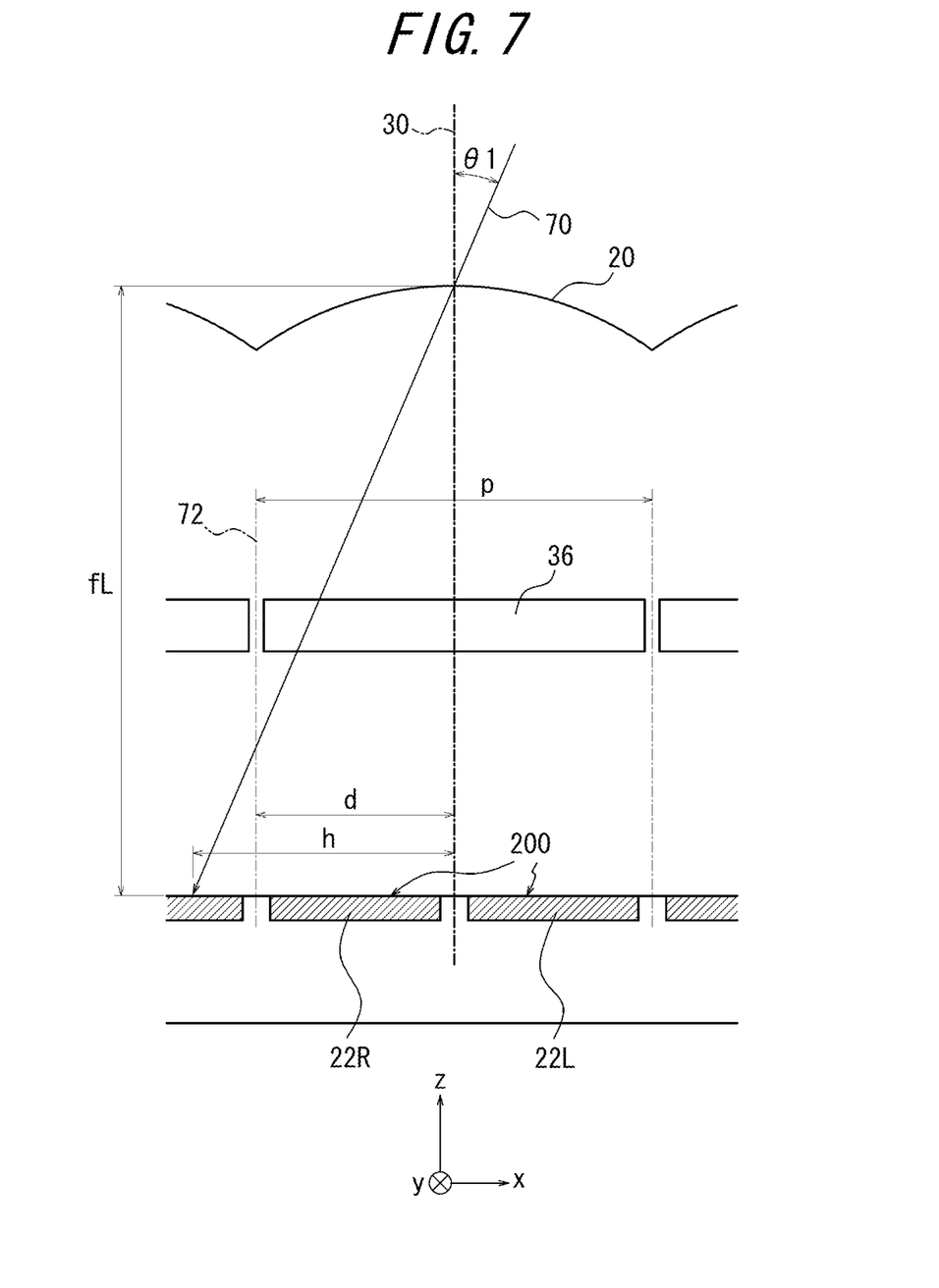
FIG. 7 illustrates an appropriate height of the wiring layer.
Figure 8:
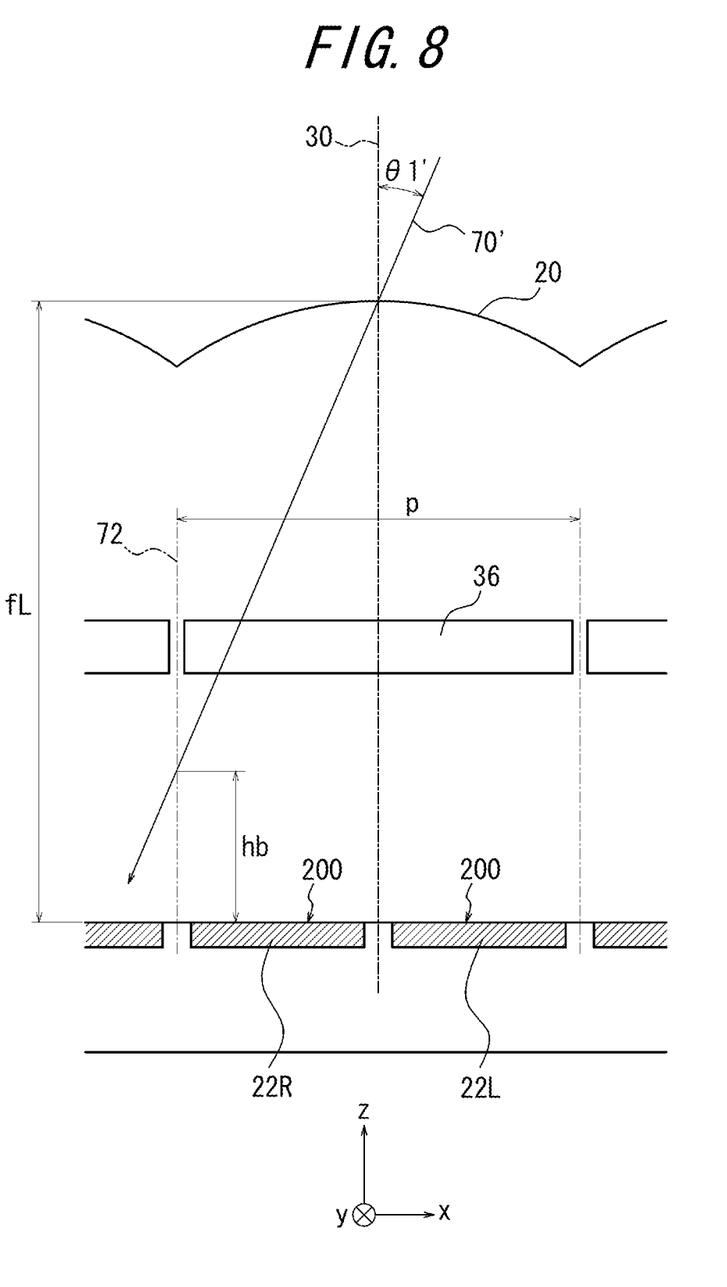
FIG. 8 illustrates an appropriate height of the wiring layer.

With reference to FIGS. 7 and 8, the preferable height of the wiring layer 38 is described. In FIGS. 7 and 8, portions of the image pickup element 10 in the cross-section of FIG. 5 are illustrated, omitting the wiring layer 38.

First, with reference to FIG. 7, the conditions are described for when light in one picture element enters the light-receiving element of an adjacent picture element. In FIG. 7, the structure shared in common with FIG. 5 is labeled with the same reference signs as FIG. 5.

Letting the angle of incidence, with respect to the optical axis 30, of a light beam 70 that passes through the exit pupil 34 of the image pickup lens 11 at the highest light beam height thereof and strikes the apex of the microlens 20 be θ1 and the F-number of the image pickup lens 11 be Fn, Equation (1) below holds.

$$\tan θ1 = 1/(2 \cdot Fn) \qquad \text{Equation (1)}$$

Next, letting the radius of curvature of the microlens 20 be r and the average refractive index of the medium from the microlens 20 to the light-receiving surface 200 of the light-receiving elements 22L and 22R be nav, the focal length fL of the microlens 20 is represented as Equation (2) below.

$$fL = r/(nav-1) \qquad \text{Equation (2)}$$

Here, the light-receiving surface 200 of the light-receiving elements 22L and 22R is provided approximately at the back focal point of the microlens 20. The image pickup lens 11 is configured so that, for example, the position of the exit pupil 34 is near infinity. Accordingly, the image of the exit pupil 34 of the image pickup lens 11 passes through the microlens 20 and forms on the light-receiving surface 200 of the light-receiving elements 22L and 22R. Here, the distance h, on the light-receiving surface 200 of the light-receiving elements 22L and 22R, from the optical axis 30 to the light beam 70 with an angle of incidence 81 into the microlens 20 is represented by Equation (3).

$$h = fL \cdot \tan θ1 \qquad \text{Equation (3)}$$

On the other hand, letting the pitch of the microlenses 20 be p, the distance d from the optical axis 30 of one microlens 20 to a border 72 with the microlens 20 of an adjacent picture element is expressed by Equation (4).

$$d = p/2 \qquad \text{Equation (4)}$$

Here, although the aperture ratio of the light-receiving elements 22L and 22R is also a factor, when h>d (Equation (5)), the light beam 70 that passes through the microlens 20 of one picture element reaches a position that is farther from the optical axis 30 than the distance d and strikes the light-receiving element of the adjacent picture element.

Accordingly, based on Equations (1) to (5), the condition for striking the light-receiving element of an adjacent picture element is represented by Equation (6).

$$r/(Fn \cdot (nav-1)) > p \qquad \text{Equation (6)}$$

where

Fn is the F-number of the image pickup lens 11, r is the radius of curvature of the microlens 20, nav is the average refractive index of the medium from the microlens 20 to the light-receiving surface 200 of the light-receiving elements 22L and 22R, and p is the pitch of the microlenses 20.

Next, with reference to FIG. 8, the height of the wiring layer 38 such that the light beam 70 does not reach an adjacent picture element is described. In FIG. 8, the structure shared in common with FIG. 7 is labeled with the same reference signs as FIG. 7.

When a light beam 70' passing through the position that is farthest from the optical axis 30 in the exit pupil 34 of the image pickup lens 11 is incident on the apex of the microlens 20 at an angle of incidence θ1', the height from the light-receiving surface 200 of the light-receiving elements 22L and 22R to where the light beam 70' crosses the border 72 of the picture elements is defined as hb. Letting the average refractive index of the medium from the apex of the microlens 20 to the height hb be nav2, Equation (7) holds.

$$(r/(nav2-1)-hb) \cdot \tan \theta 1' = p/2 \qquad \text{Equation (7)}$$

Therefore, if the height of the wiring layer 38 is set so as to block this light beam, the light beam will not reach the adjacent picture element. In other words, it suffices for the height of the wiring layer 38 to be at least hb in Equation (8) below, which is derived from Equation (7).

$$hb = r/(nav2-1) - p \cdot Fn \qquad \text{Equation (8)}$$

Substituting the Fn of the brightest image pickup lens 11 in use into Equation (8) above yields the necessary height of the wiring layer 38. By thus arranging the wiring layer 38 to have a height of hb or higher, the light beam passing through the microlens 20 may be prevented from reaching the light-receiving element of an adjacent picture element.

Conversely, given the height hb of the wiring layer 38, the F-number of the brightest image pickup lens 11 in use may be calculated by transforming Equation (8) into Equation (9).

$$Fn = (1/p) \cdot (r/(nav2-1) - hb) \qquad \text{Equation (9)}$$

EXAMPLES

Example 1

The following values are adopted in Example 1.

radius of curvature of the microlens 20: r=0.01 mm (spherical)

pitch of the microlens 20: p=0.01 mm average refractive index of the medium from the microlens 20 to the top surface of the wiring layer 38: nav2=1.5 average refractive index of the medium from the microlens to the light-receiving surface 200 of the light-receiving elements 22L and 22R: nav=1.5 height of the wiring layer 38: hb=0.006 mm

Here, the wiring layer 38 is made of a metal such as aluminum and is substantially opaque with respect to light. In Example 1, based on Equation (9), the light beam does not reach the light-receiving element of an adjacent picture element even when using an image pickup lens 11 with a brightness of up to F1.4. Accordingly, even when using a relatively bright image pickup lens 11 at F1.4, problems such as a reduction in resolution and color drift of the stereoscopic image may be avoided.

Example 2

The following values are adopted in Example 2.

radius of curvature of the microlens 20: r=0.015 mm (spherical)

pitch of the microlens 20: p=0.01 mm average refractive index of the medium from the microlens 20 to the top surface of the wiring layer 38: nav2=1.5 average refractive index of the medium from the microlens 20 to the light-receiving surface 200 of the light-receiving elements 22L and 22R: nav=1.5 height of the wiring layer 38: hb=0.015 mm

Here, the wiring layer 38 is made of a metal such as aluminum and is substantially opaque with respect to light. In Example 2, based on Equation (9), the light beam does not reach the light-receiving element of an adjacent picture element even when using an image pickup lens 11 with a brightness of up to F1.5. Accordingly, even when using a relatively bright image pickup lens 11 at F1.5, problems such as a reduction in resolution and color drift of the stereoscopic image may be avoided.

Example 3

The following values are adopted in Example 3.

radius of curvature of the microlens 20: r=0.02 mm (spherical)

pitch of the microlens 20: p=0.01 mm average refractive index of the medium from the microlens 20 to the top surface of the wiring layer 38: nav2=1.6 average refractive index of the medium from the microlens 20 to the light-receiving surface 200 of the light-receiving elements 22L and 22R: nav=1.6 height of the wiring layer 38: hb=0.0033 mm

Here, the wiring layer 38 is made of a metal such as aluminum and is opaque with respect to light. In Example 3, based on Equation (9), a light beam passing through the microlens 20 of a picture element does not reach the light-receiving element of an adjacent picture element even when using an image pickup lens 11 with a brightness of up to F3. Accordingly, even when using a relatively bright image pickup lens 11 at F3, problems such as a reduction in resolution and color drift of the stereoscopic image may be avoided.

Although the present invention has been described based on the drawings and examples, it should be noted that various changes and modifications will be apparent to those skilled in the art based on the present disclosure. Therefore, such changes and modifications are to be understood as included within the scope of the present invention. For example, the functions and the like included in the various means and the like may be reordered in any logically consistent way. Furthermore, means may be combined into one or divided. For example, in the example described above, the image pickup element includes a spherical microlens for each picture element, yet alternatively a configuration with a cylindrical lens may be used.

As described above, the present embodiment allows for the prevention of a reduction in resolution and in the stereoscopic effect of a stereoscopic image.

REFERENCE SIGNS LIST

10: Image pickup element
11: Image pickup lens
20: Microlens
22: Pair of light-receiving elements
38: Wiring layer

The invention claimed is:

1. An image pickup element comprising:

a pair of light-receiving elements that are configured to receive light from an object and are disposed for each lens among two-dimensionally arranged lenses, one of the light-receiving elements outputting a pixel signal forming one captured image in a pair of captured images having parallax for displaying a stereoscopic image of the object, and the other of the light-receiving elements outputting a pixel signal forming the other captured image in the pair of captured images; and wiring that is disposed between the light-receiving elements and configured to transmit an input signal or an output signal of the light-receiving elements, wherein $1.4 \leq (1/p) \cdot (r/(nav2-1)-hb) \leq 3$, where r is a radius of curvature of each of the lenses, p is a pitch of the lenses, nav2 is an average refractive index of a medium between the lenses and the wiring, and hb is a distance from a light-receiving surface of the light-receiving elements to the wiring.

2. The image pickup element according to claim 1, wherein the wiring is disposed between pairs of the light-receiving elements.

3. An image pickup apparatus comprising: the image pickup element according to claim 1; and a display unit configured to display a stereoscopic image based on the pair of captured images according to claim 1.

4. An image pickup apparatus comprising: the image pickup element according to claim 2; and a display unit configured to display a stereoscopic image based on the pair of captured images according to claim 2.

* * * * *